United States Patent [19]
Yoshida

[11] Patent Number: 5,601,732
[45] Date of Patent: Feb. 11, 1997

[54] PROTECTING FILM FOR WAFER AND METHOD FOR GRINDING SURFACE OF WAFER WITH THE SAME

[75] Inventor: Masahiro Yoshida, Nagasaki, Japan

[73] Assignee: Sony Corporation, Japan

[21] Appl. No.: 555,786

[22] Filed: Nov. 9, 1995

[30]    Foreign Application Priority Data

Nov. 15, 1994   [JP]   Japan ................... 6-305528

[51] Int. Cl.⁶ ...................................................... B44C 1/22
[52] U.S. Cl. ........................ 216/36; 216/52; 216/90; 156/631.1; 156/645.1; 156/637.1; 156/345; 134/34
[58] Field of Search ............... 156/630.1, 631.1, 156/645.1, 654.1, 662.1, 637.1, 345; 216/33, 34, 36, 52, 90; 134/32, 34

[56]    References Cited

U.S. PATENT DOCUMENTS 4,246,054  1/1981  Nester ........................... 216/36 X
5,209,815  5/1993  Fleming et al. ................ 216/36

Primary Examiner—William Powell
Attorney, Agent, or Firm—Ronald P. Kananen

[57]    ABSTRACT

Upon grinding a back of a substrate, a protecting tape made of a material soluble to IPA (isopropanol), for example, a vinyl acetate thermoplastic adhesive is appended on the surface of a pattern-formed layer of a wafer, grinding the back, dipping the wafer in a cleaning vessel containing IPA, and dissolving and removing the protecting tape from the wafer, thereby giving no damages to the wafer, and reducing the number of operation steps.

11 Claims, 4 Drawing Sheets

ABSORPTION

GRINDING

5,601,732

PROTECTING FILM FOR WAFER AND METHOD FOR GRINDING SURFACE OF WAFER WITH THE SAME

BACKGROUND OF THE INVENTION

1. Field of the Invention

The present invention relates to a protecting film for a substrate surface and more specifically to a protecting film for a substrate surface which is appended to the surface of the substrate for protecting it upon grinding a back of the substrate, as well as a method for grinding a back of a substrate by using the protecting film for a substrate surface.

2. Description of Related Art

Upon grinding a back of a wafer, a protecting tape made of a polyolefinic synthetic resin has been appended to a surface of the wafer for protecting the surface of the wafer on which a pattern is formed. Existent steps for grinding the back of the wafer are to be explained with reference to FIG. 1A to FIG. 1D.

At first, as shown in FIG. 1A, a wafer 1 having a pattern-formed layer 2 on a surface is provided and a protecting film 3 is appended on the surface (refer to FIG. 1B). Then, the back 4 of the wafer is ground by a grinding device (refer to FIG. 1C). Subsequently, after peeling the protecting tape 3 appended on the surface of the wafer 1 by a tape peeler (refer to FIG. 1D), the wafer is cleaned by a cleaning device using isopropanol as a cleaning liquid.

A method of peeling the protecting film by the tape peeler will be explained more specifically with reference to FIG. 2. For peeling the protecting tape 3, an orientation flat of the wafer 1 (usually referred to as ori-fla) is at first aligned to a positioning line on a peeling stage 5, and the wafer is placed with the protecting tape 3 being on the upper side to the peeling stage 5 of the tape peeler and adsorbed in a direction of an arrow (FIG. 2A). Then, a releasing tape 6 is placed on the protecting tape 3, and an append roller 7 is urged under rolling to append the peeling tape 6 on the protecting tape 3 (refer to FIG. 2B). Successively, an excess portion of the peeling tape 6 is laid over the appended portion of the releasing tape, and the excess portion is pulled to peel the protecting tape 3 together with the peeling tape 6 (refer to FIG. 2C). Finally, the wafer 1 is separated from the peeling stage 5 and contained in a cassette to complete a tape peeling operation.

The wafer ground at the back has an extremely low mechanical strength, so that it chips easily or causes partial depletion when undergoing even a small external force. Accordingly, upon conducting the peeling operation to the protecting tape, when the peeling tape is urged onto the protecting tape by the append roller, or when the excess portion of the peeling tape is pulled to peel the protecting tape together with the peeling tape, the wafer often suffers from damages, and the rate of occurrence for wafer chipping reaches as high as about 0.03% based on the entire number of wafers even at the present in which the grinding thickness for the wafer is 400 µm.

On the other hand, along with a demand for reducing the thickness of semiconductor devices, it has become necessary to reduce the grinding thickness for the wafer to less than 300 µm. Such a thin-walled wafer further suffers from a reduction of the strength against the external force and is damaged easily when undergoing even a slight force; thus, it is considered that the rate of occurrence for wafer chipping will amount to about 5%.

SUMMARY OF THE INVENTION

A first object of the present invention is to provide a protecting tape to be appended on a surface of a wafer upon grinding a back of the wafer for protecting the surface thereof and which can be peeled without damaging the wafer.

A second object of the present invention is to provide a method of grinding a back of a wafer by using a protecting tape.

The present inventor has considered that there is a limit for preventing a wafer from damages, even by the improvement of a tape peeler intended for preventing the wafer from damages insofar as a protecting tape is peeled by a mechanical means, and has accomplished the present invention by taking notice when peeling the protecting tape by a chemical means.

A protecting tape for a substrate surface according to the present invention for attaining the foregoing object is appended to a surface of a substrate for protecting the surface upon grinding a back of the substrate, and the tape is formed with a material soluble to a predetermined solvent.

After peeling the protecting tape from the substrate surface, since the substrate is usually cleaned by using isopropanol (IPA) as a cleaning liquid, in a preferred embodiment of the present invention, the predetermined solvent is isopropanol and the protecting tape for wafer surface is formed with a material soluble to isopropanol in a preferred embodiment of the present invention.

Further, either of a vinyl acetate type thermoplastic adhesive or an isoprene rubber type adhesive can be selected as the material soluble to isopropanol.

In the present invention, grinding has a general meaning including processing to the back of the substrate such as polishing. Upon grinding the back of the substrate by using the protecting tape for a substrate surface described above, a method of grinding the back of a substrate according to the present invention comprises the steps of:

appending a protecting tape for the substrate surface comprising a material soluble to isopropanol on the surface of the substrate and then grinding the back of the wafer and dipping the substrate which is ground at the back in isopropanol, dissolving the protecting tape for the substrate surface to remove the tape from the surface of the substrate and, at the same time, cleaning the substrate.

According to the constitution of the present invention, the protecting tape for a substrate surface can be removed from the substrate without applying an external mechanical force, but by chemical processing instead of mechanical peeling, by forming a protecting tape for the substrate surface with a material soluble to a predetermined solvent, grinding a back of the substrate, and then dissolving and removing the protecting tape for a substrate surface by the predetermined solvent.

Particularly, when a protecting tape for a substrate surface made of a material soluble to isopropanol is used, the protecting tape for the substrate surface can be dissolved and removed from the substrate, at the same time as cleaning for the substrate, upon cleaning the substrate after grinding the back.

Therefore, since a requirement for exerting mechanical force on the substrate is remarkably reduced, the rate of occurrence for the damage of the wafer can be reduced remarkably.

DETAILED DESCRIPTION OF THE PREFERRED EMBODIMENTS

The present invention will be explained more specifically by way of preferred embodiments with reference to the accompanying drawings.

Figure 1A:
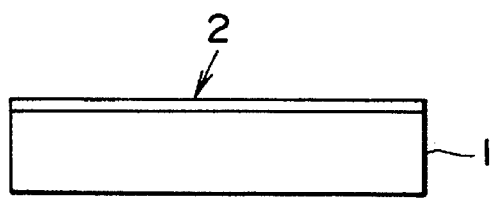
FIG. 1A to FIG. 1D are cross sectional views for a substrate in each of steps in a method of grinding a back of the substrate in the related art.
Figure 1B:
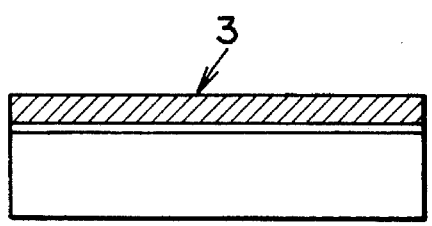
Figure 1C:
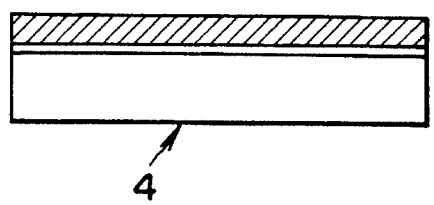
Figure 1D:
Figure 2A:
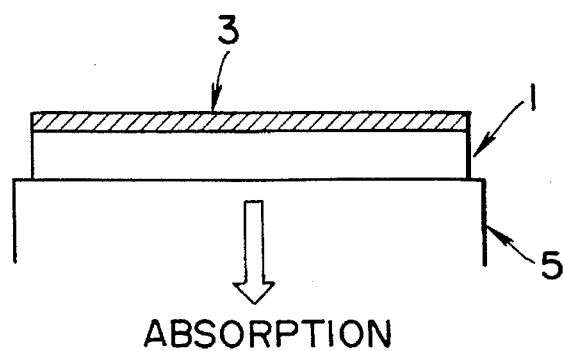
FIG. 2A to FIG. C are schematic views for explaining a peeling operation of a protecting tape in the related art.
Figure 2B:
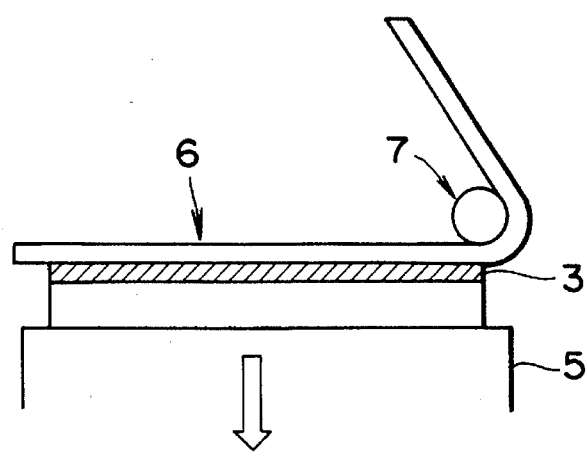
Figure 2C:
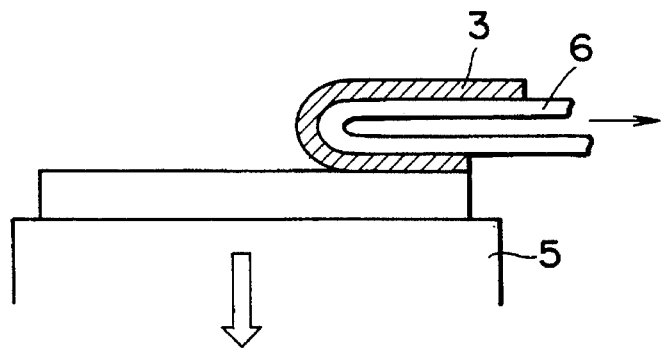
Figure 3A:
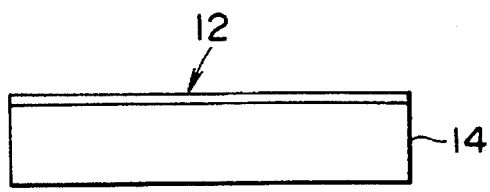
FIG. 3A to FIG. 3D are cross sectional views of a substrate in each of steps of an operation for grinding the back of a substrate by using a protecting tape for a substrate surface as a first embodiment according to the present invention.
Figure 3B:
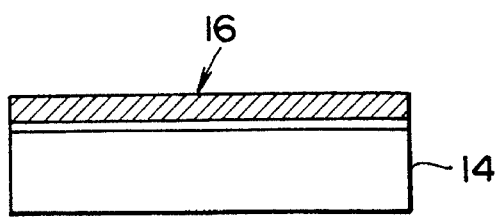
Figure 3C:
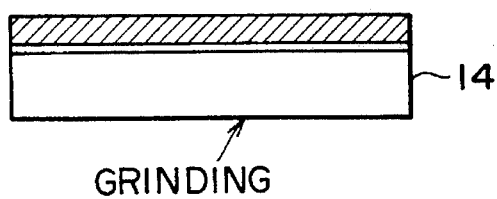
Figure 3D:
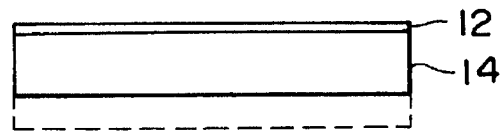
Figure 4A:
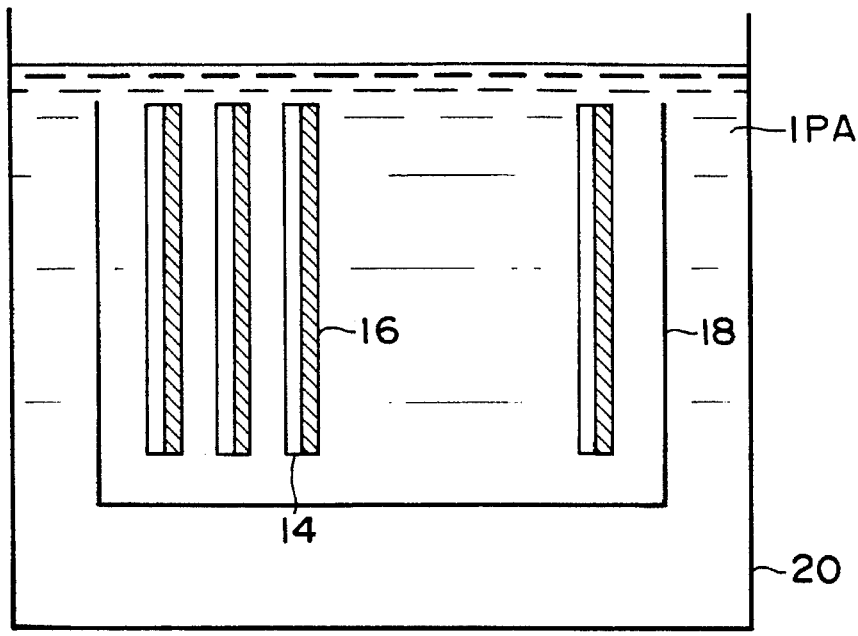
FIG. 4A and FIG. 4B are schematic views illustrating the state of a step for dissolving a protecting tape for a substrate surface with IPA.
Figure 4B:
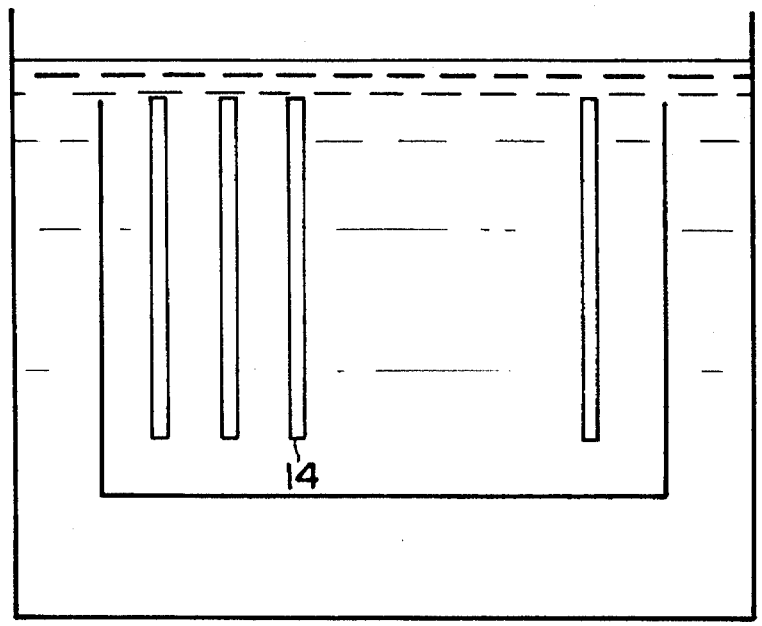

FIG. 3A to FIG. 3D are cross sectional views of a substrate in each step of an operation for grinding a back of a substrate by using a protecting tape for a substrate surface in a first embodiment according to the present invention, and FIG. 4A and FIG. 4B are schematic views illustrating the state of a step for dissolving a protecting tape for the substrate surface with isopropanol (hereinafter simply referred to as IPA).

At first, a preferred embodiment for the method of grinding the back of a substrate according to the present invention is to be explained, FIG. 3A shows a wafer 14 to be put to grinding. The wafer has, for example, 625 μm thickness and 6 inch diameter. A pattern-formed layer 12 comprising, for example, active or passive devices, and wirings, is formed on the upper surface of the substrate 14.

In FIG. 3B, after receiving the wafer 14, a substrate protecting tape 16 made of a material soluble to IPA, for example, a vinyl acetate type thermoplastic adhesive, is appended on the surface of the wafer 14.

The substrate protecting tape 16 has 120 to 150 μm thickness. The tape is appended on the substrate by using a roller pressing method or a cutting method.

Then, as shown in FIG. 3C, the back of the wafer 14 is ground by a grinding device. The wafer is finished to a thickness from 625 μm to 350 or 390 μm under the conditions in which for example, with the number of rotations of a spindle at 5500 rpm, a grinding speed at 0.3 μm/sec and the number of table rotations at 120 rpm.

Further, the wafer ground at the back is dipped in a cleaning vessel containing IPA to dissolve the protecting tape 16 for substrate surface and remove the same from the substrate 14 as shown in FIG. 3D.

IPA is contained in a cleaning vessel having a volume, for example, of 23 liters and the temperature is set to 40° C. The wafer is dipped into IPA in the cleaning vessel for about 10 min. to remove the protecting tape on the substrate.

A second embodiment according to the present invention is to be explained next.

For dissolving the substrate protecting tape 16 with IPA and removing the tape from the wafer 14, the wafer 14 appended with the substrate protecting tape 16 is contained in a cleaning carrier 18, for example, as shown in FIG. 4A and dipped into IPA in the cleaning vessel 20, and bubbles of an inert gas such as a nitrogen gas are jetted out of nozzles at the bottom of the cleaning vessel to agitate the IPA. Substrates, each having a 6 inch diameter, are arranged, for example, by 25 sheets each at 4.6 mm distance and secured to the wafer carrier 18 respectively. Further, the side wall of the vessel for the wafer carrier 18 has an "apertured" structure, so that the IPA liquid can easily move into and out of the vessel and the tape 16 can be detached uniformly.

In this case, the temperature for the IPA in the cleaning bath was set to 40° C. Further, agitating bubbles are supplied from the bottom of the vessel at 3000 cc/min, and the wafer dipping time is set to about 15 min.

FIG. 4B shows a state in which the substrate protecting tape 16 is dissolved and removed.

As a result, the operation efficiency can be shortened by TAT 20% corresponding to saving for the tape peeling operation.

According to the constitution of the present invention, upon grinding the back of the substrate, the protecting tape for a substrate surface which is appended to the substrate surface for protecting the surface is formed with a material soluble to a predetermined solvent and, after grinding the back of the substrate, the protecting tape for substrate surface is dissolved and removed with a predetermined solvent, whereby the protecting tape for substrate surface can be removed from the substrate without applying external mechanical force, but by a chemical processing instead of mechanical peeling. Accordingly, since it is no longer necessary to exert mechanical force on the substrate upon peeling the protecting tape for substrate surface, the rate for the occurrence of damages to the wafer can be reduced greatly. Further, use of the protecting tape for the substrate surface according to the present invention can also cope with the demand for reducing the thickness of the substrate.

Particularly, when a protecting tape for the substrate surface is used which is made of a material soluble to isopropanol, it is suitable since the protecting tape for substrate surface can also be dissolved and removed from the substrate, at the same time as cleaning for the substrate upon substrate cleaning after grinding of the back. Furthermore, this can reduce the number of steps in the grinding operation for the back of the substrate, thereby improving the working operation efficiency.

What is claimed is:

1. A protecting tape for a substrate surface which is appended to a surface of a substrate for protecting the surface of the substrate upon grinding a back of the substrate, wherein said protecting tape is formed with a material soluble to a solvent.

2. A protecting tape as defined in claim 1, wherein the solvent is isopropanol and the protecting tape for the substrate surface is formed with a material soluble to isopropanol.

3. A protecting tape as defined in claim 2, wherein a vinyl acetate type thermoplastic adhesive is selected as the material soluble to isopropanol.

4. A method of grinding a back of a substrate comprising the steps of:

appending a protecting tape for a substrate surface on a surface of a substrate and grinding a back of the substrate;

dipping the substrate ground at the back into isopropanol; and dissolving the protecting tape for the substrate surface and removing the tape from the surface of the substrate.

5. A method of grinding a back of a substrate as defined in claim 4, wherein the method comprises a step of dissolving the protecting tape for the substrate surface and removing the tape from the surface of the substrate and a step of cleaning said substrate, simultaneously.

6. A method of grinding a back of a substrate as defined in claim 4, wherein the inside of a cleaning vessel containing isopropanol is agitated during a step of dipping the substrate ground at the back in isopropanol.

7. A method of grinding a back of a substrate as defined in claim 6, wherein bubbles of an inert gas are generated to agitate the inside of the cleaning vessel.

8. A method of grinding a back of a substrate as defined in claim 7, wherein nozzles are disposed at the bottom of the cleaning vessel for generating the bubbles of the inert gas.

9. A method of grinding a back of a substrate as defined in any one of claims 7 or 8, wherein the inert gas is a nitrogen gas.

10. A method of grinding a back of a substrate as defined in any one of claims 4 or 5, wherein the thickness of the substrate ground by the method of grinding the back of the substrate is made not greater than 300 μm.

11. A protecting tape as defined in claim 2, wherein an isoprene rubber type adhesive is selected as the material soluble to isopropanol.

* * * * *